United States Patent
Lim et al.

(10) Patent No.: US 8,699,282 B2
(45) Date of Patent: Apr. 15, 2014

(54) SEMICONDUCTOR MEMORY APPARATUS

(75) Inventors: Kyu Nam Lim, Icheon-si (KR); Woong Ju Jang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 63 days.

(21) Appl. No.: 13/563,014

(22) Filed: Jul. 31, 2012

(65) Prior Publication Data
US 2013/0155784 A1    Jun. 20, 2013

(30) Foreign Application Priority Data

Dec. 15, 2011    (KR) .......................... 10-2011-0135694

(51) Int. Cl.
*G11C 7/06*    (2006.01)

(52) U.S. Cl.
USPC ....... 365/189.05; 365/190; 365/205; 365/207

(58) Field of Classification Search
None
See application file for complete search history.

(56) References Cited

U.S. PATENT DOCUMENTS 5,058,073 A * 10/1991 Cho et al. ....................... 365/205
5,949,729 A *  9/1999 Suyama et al. ............... 365/207
6,256,246 B1 *  7/2001 Ooishi .......................... 365/205
7,391,648 B2    6/2008 Pekny
2009/0109779 A1  4/2009 Kitayama

FOREIGN PATENT DOCUMENTS

KR    1020020034636 A    5/2002

OTHER PUBLICATIONS

Satoru Akiyama, Low-Vt Small-Offset Gated Preamplifier for Sub-1V Gigabit DRAM Arrays, IEEE International Solid-State Circuits Conference, 2009, p. 142-144, Hitachi, Kokubunji, Japan.

\* cited by examiner

*Primary Examiner* — Tan T. Nguyen
(74) *Attorney, Agent, or Firm* — William Park & Associates Patent Ltd.

(57) ABSTRACT

A semiconductor memory apparatus includes: a first sense amplification unit including first and second inverters configured to be driven to voltage levels of a power driving signal and a ground driving signal and forming a latch structure between a bit line and a bit line bar; and a second sense amplification unit including first and second transistors configured to be driven to the voltage level of the ground driving signal and forming a latch structure between the bit line and the bit line bar when an activated switching signal is applied, wherein a threshold voltage of the second sense amplification unit is set lower than that of the first sense amplification unit.

20 Claims, 7 Drawing Sheets

SEMICONDUCTOR MEMORY APPARATUS

CROSS-REFERENCES TO RELATED APPLICATION

The present application claims priority under 35 U.S.C. §119(a) to Korean application number 10-2011-0135694 filed on Dec. 15, 2011, in the Korean Intellectual Property Office, which is incorporated herein by reference.

BACKGROUND

1. Technical Field

The present invention relates generally to a semiconductor memory apparatus, and more particularly to a semiconductor memory apparatus including a bit line sense amplifier.

2. Related Art

A bit line sense amplifier used in a semiconductor memory apparatus senses and amplifies data stored in a memory cell. The bit line sense amplifier is coupled to a bit line pair including a bit line BL connected to the memory cell, and amplifies the voltage level of data detected from the bit line BL with which the charge of memory cell is shared.

Figure 1:
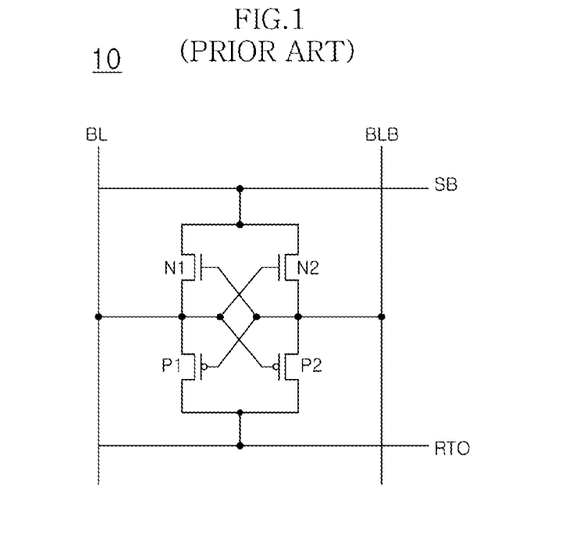
FIG. 1 is a circuit diagram of a known bit line sense amplifier including an inverter pair in a latch structure.

FIG. 1 illustrates a known bit line sense amplifier. Referring to FIG. 1, the bit line sense amplifier includes two pairs of inverters N1, P1, N2, and P2 forming a latch structure between a bit line pair BL and BLB. Such a bit line sense amplifier serves to amplify the voltage level of data detected from the bit line BL with which the charge of memory cell is shared.

During a sensing operation, as levels of bit line sense amplifier driving signals, which have been maintaining predetermined precharge voltage levels, changes, e.g., as levels of a power driving signal RTO (e.g., core voltage level) and a ground driving signal SB (e.g., ground voltage level), each of which has been maintaining VCORE/2, is transitioned to a high voltage and a low voltage, respectively, the bit line sense amplifier performs a sensing operation. The voltage level of the bit line BLT is transitioned to a core voltage level Vcore (or a ground voltage level VSS) and the voltage level of the bit line bar BLB is transitioned to the ground voltage level VSS (or the core voltage level Vcore).

However, in the above-described known bit line sense amplifier, a low voltage characteristic may be deteriorated due to a high threshold voltage of a MOS transistor forming the bit line sense amplifier. Furthermore, if the threshold voltage is reduced so as to improve the low voltage characteristic, a leakage current may increase. Therefore, there is a limit in reducing the threshold voltage.

Figure 2:
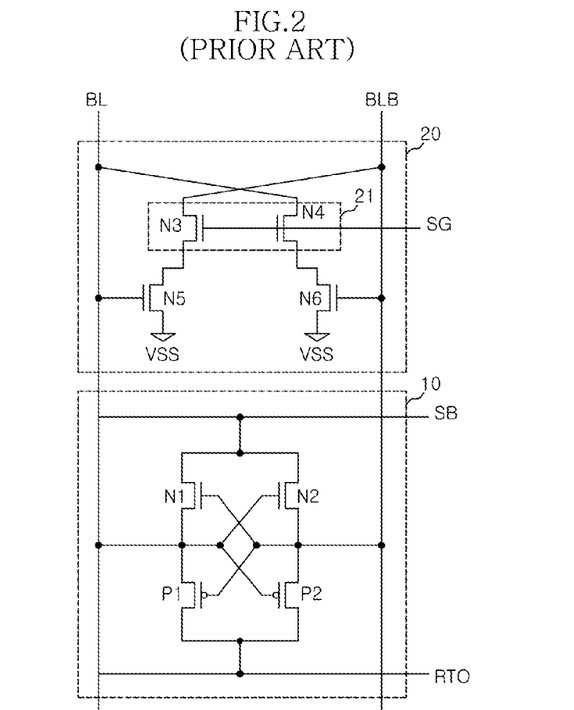
FIG. 2 is a circuit diagram of a bit line sense amplifier which additionally includes a sense amplification unit having a low threshold is voltage.

FIG. 2 is a circuit diagram of a bit line sense amplifier which includes an additional sense amplification unit having a low threshold voltage.

The bit line sense amplifier illustrated in FIG. 2, which has been developed to improve a low voltage characteristic, further includes the additional sense amplification unit having a lower threshold voltage than the sense amplifier illustrated in FIG. 1.

The bit line sense amplifier of FIG. 2 includes a first sense amplification unit 10 and a second sense amplification unit 20.

The first sense amplification unit 10 may include the sense amplifier illustrated in FIG. 1. The first sense amplification unit 10 is driven to a voltage level of a power driving signal RTO and a ground driving signal SB, and includes first inverters N1 and P1 and second inverters N2 and P2 forming a latch structure between a bit line BL and a bit line bar BLB.

When a word line (not illustrated) is enabled, the bit line BL shares the charge stored in a memory cell (not illustrated). Also, bit line sense amplifier driving signals, e.g., the power driving signal RTO and the ground driving signal SB maintain predetermined precharge voltage levels (e.g., VCORE/2). When the word line is enabled, the power driving signal RTO and the ground driving signal SB is transitioned to a core voltage level and a ground voltage level, respectively.

Then, the bit line sense amplifier performs a sensing operation. The bit line sense amplifier senses a voltage difference between the bit line pair BL and BLB, If there is a voltage difference, the bit line sense amplifier pulls the bit line BL up to the core voltage level (or the ground voltage level) and pulls the bit line bar BLB down to the ground voltage level (or the core voltage level).

However, in order for the bit line sense amplifier to perform a sensing operation, the voltage level corresponding to the charge shared by the bit line pair BL and BLB, e.g., the voltage level corresponding to the charge shared by the bit line BL should be higher than the threshold voltage of the transistors N1, P1, N2, and P2.

The second sense amplification unit 20 includes a sense amplifier having a lower threshold voltage than the transistors N1, P1, N2, and P2 used in the first sense amplifier 10. The second sense amplification unit 20 includes a transistor pair N5 and N6 forming, for example, a latch structure between the bit line BL and the bit line bar BLB and activated in response to an activated switching signal SG.

The transistor pair includes fifth and sixth NMOS transistors N5 and N6 having a gate terminal connected to the bit line BL or the bit line bar BLB, a drain terminal connected to the other bit line, and a source terminal connected to a ground voltage VSS.

The above-described transistor pair N5 and N6 forming, for example, a latch structure may change a low level of data of the bit line BL or the bit line bar BLB to the ground voltage level, thereby amplifying the data. For example, when high-level data is loaded on the bit line BL, the fifth NMOS transistor N5 is turned on to pull the bit line bar BLB down to the ground voltage level VSS. On the other hand, when high-level data is loaded on the bit line bar BLB, the sixth NMOS transistor N6 is turned on to pull the bit line BL down to the ground voltage level VSS.

Since the fifth and sixth NMOS transistors N5 and N6 have a low threshold voltage, a leakage current may increase. Therefore, the second sense amplification unit 20 may further include a voltage passing section 21 between the bit line pair BL and BLB and the fifth and sixth NMOS transistors N5 and N6. The voltage passing section 21 is configured to connect the bit line pair BL and BLB to the fifth and sixth NMOS transistors N5 and N6 in response to a switching signal SG.

The switching signal SG is activated when an amplification operation for the data shared by the bit line is requested. For example, the switching signal SG may be activated when an active signal is inputted to perform a bit line sensing operation, a read operation, or a write operation.

The voltage passing section 21 may include third and fourth NMOS transistors N3 and N4. The third NMOS transistor N3 is configured to connect the bit line bar BLB and a drain terminal of the fifth NMOS transistor N5 in response to the switching signal SG, and the fourth NMOS transistor N4 is configured to connect the bit line BL and a drain terminal of the sixth NMOS transistor N6 in response to the switching signal SG. That is, the voltage passing section 21 may control the second sense amplification unit 20 to perform a sensing operation only at a specific time.

That is, since the second sense amplification unit 20 is enabled by the voltage passing unit 21 only when data sensing is necessary, it is possible to block a leakage current caused by a low threshold voltage to a predetermined extent.

However, since the fifth and sixth NMOS transistors N5 and N6 of the second sense amplification unit 20 are connected to the ground voltage VSS, a leakage current in a standby state may occur in a path where the third and fifth NMOS transistors N3 and N5 are connected to or the fourth and sixth NMOS transistors N4 and N6 are connected to the bit line pair BL and BLB which have been precharged to the precharge voltage (for example, VCORE/2).

SUMMARY

In an embodiment of the present invention, a semiconductor memory apparatus includes: a first sense amplification unit including first and second inverters configured to be driven to a power driving signal and a ground driving signal and connected in a latch structure between a bit line and a bit line bar; and a second sense amplification unit including first and second transistors configured to be driven to the ground driving signal and connected in a latch structure between the bit line and the bit line bar when an activated switching signal is applied, wherein a threshold voltage of the second sense amplification unit is set lower than that of the first sense amplification unit.

In an embodiment of the present invention, a semiconductor memory apparatus includes: a first sense amplification unit including first and second inverters configured to be driven to a power driving signal and a ground driving signal and connected in a latch structure between a bit line and a bit line bar; a control unit configured to generate an activated switching signal according to an activated active signal, a read signal and a write signal; and a second sense amplification unit including first and second NMOS transistors configured to be driven to the ground driving signal and connected in a latch structure between the bit line and the bit line bar when the activated switching signal is applied, wherein a threshold voltage of the second sense amplification unit is set lower than that of the first sense amplification unit.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

Figure 3:
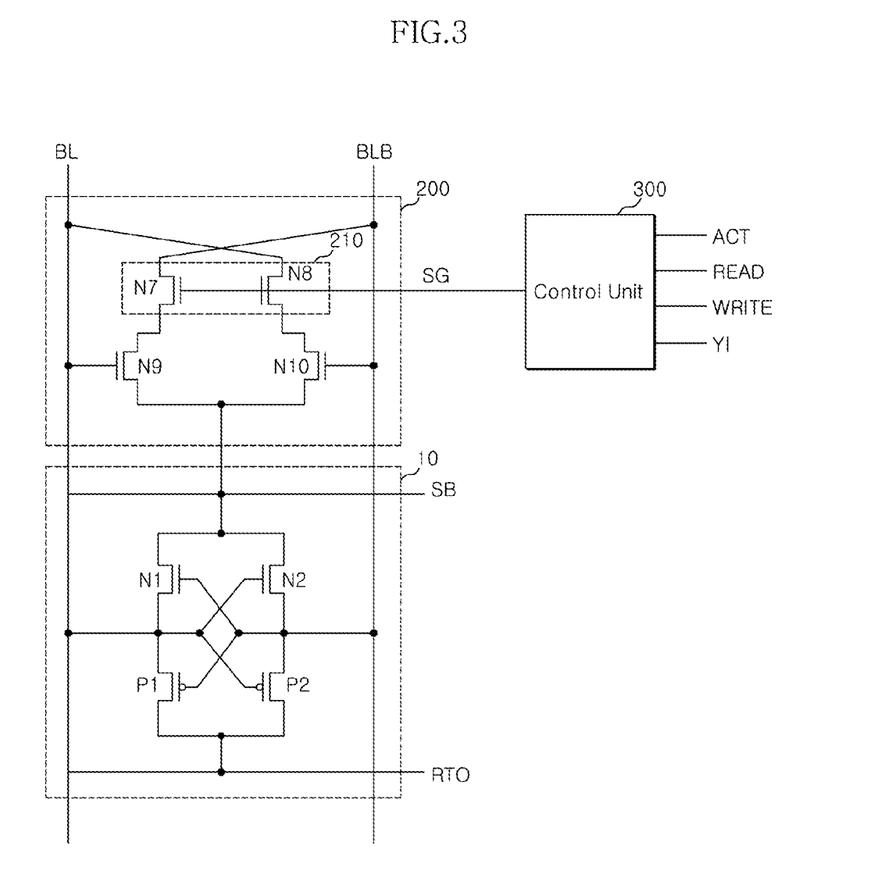
FIG. 3 is a configuration diagram of a semiconductor memory apparatus including a bit line sense amplifier according to an embodiment of the present invention.

FIG. 3 is a configuration diagram illustrating a semiconductor memory apparatus including a bit line sense amplifier according to an embodiment of the present invention.

The semiconductor memory apparatus of FIG. 3 includes bit line sense amplifiers 10 and 200 and a controller 300 configured to generate a switching signal SG for controlling the bit line sense amplifiers.

The bit line sense amplifiers 10 and 200 include a first sense amplification unit 10 and a second sense amplification unit 200.

The first sense amplification unit 10 may include the known sense amplifier illustrated in FIG. 1, and may have the same configuration and operation as described above.

The second sense amplification unit 200 includes a transistor pair, e.g., ninth and tenth NMOS transistors N9 and N10. When an activated switching signal SG is applied, the gate of the ninth NMOS transistor N9 may be coupled to the drain of the tenth NMOS transistor N10, and the gate of tenth NMOS transistor N10 may be coupled to the drain of the ninth NMOS transistor N9. The ninth NMOS transistor N9 and tenth NMOS transistor N10 may be driven to the voltage level of the ground driving signal SB.

The second sense amplification unit 200 may have a similar configuration and operation to the second sense amplification unit 20 described with reference to FIG. 2. However, while the source terminals of the fifth and sixth NMOS transistors N5 and N6 of the second sense amplification unit 20 illustrated in FIG. 2 are connected is to the ground voltage VSS, source terminals of the ninth and tenth NMOS transistors N9 and N10 of the second sense amplification unit 200 illustrated in FIG. 3 are connected to the ground driving signal SB.

The second sense amplification unit 200 may also include a voltage passing section 210 arranged between the bit line pair BL and BLB and the ninth and tenth N9 and N10. The voltage passing section 210 is configured to connect the bit line pair BL and BLB and the ninth and tenth NMOS transistors N9 and N10 in response to the switching signal SG. The voltage passing section 210 may include seventh and eighth NMOS transistors N7 and N8.

Since the second sense amplification unit 20 illustrated in FIG. 2 is driven to the ground voltage VSS at all times, a leakage current, in a standby state, occurs in a path where the third and fifth NMOS transistor N3 and N5 are connected to or the fourth and sixth NMOS transistors N4 and N6 are connected to the bit line pair BL and BLB which have been precharged to the precharge voltage (for example, VCORE/2).

However, since the second sense amplification unit 200 according to an embodiment of the present invention is driven to the ground driving voltage SB, the second sense amplification unit 200 is driven to the precharge voltage level in a standby state and driven to the ground voltage level after a time point where the bit line sense amplifier is driven, according to the level of the ground driving voltage SB. Therefore, since the voltage levels of the bit line pair BL and BLB and the ground driving voltage SB are equal to the precharge voltage level in a standby state, a leakage current may be minimized.

Furthermore, since the second sense amplification unit 200 is driven to the ground voltage level when driven as the bit line sense amplifier, the second sense amplification unit 200 may amplify the voltage level of data shared by the bit line pair BL and BLB, e.g., the voltage level of data shared by the bit line BL like the second sense amplification unit 20 of FIG. 2.

The control unit 300 is configured to generate a switching signal SG in response to an active signal ACT, a read signal READ, and a column select signal YI.

As described above, the switching signal SG is activated when a sensing operation for the data shared by the bit line pair, e.g., the bit line BL is requested. Therefore, when the active signal ACT, the read signal READ, and the column select signal YI are input and logic values are combined to drive a bit line sense amplifier connected to the corresponding bit line pair BL and BLB, the controller 300 activates the switching signal SG.

For example, when a word line (not illustrated) is activated in response to an activated active signal ACT and the levels of the bit line sense amplifier driving signals RTO and SB are transitioned to the core voltage and the ground voltage level, respectively, the control unit 300 activates the switching signal SG and controls the second sense amplification unit 200 to perform a sensing operation.

Furthermore, during a read operation, when an activated read signal READ is inputted and the column select signal YI is activated to select the corresponding bit line pair BL and BLB, the control unit 300 activates the switching signal SG and controls the second sense amplification unit 200 to perform a sensing operation.

Furthermore, even when receiving a write signal WRITE to perform a write operation, the control unit 300 may activate the switching signal SG to operate the second sense amplification unit 200.

During the write operation, however, data inputted from outside are applied to the bit line pair BL and BLB, e.g., the bit line BL. Therefore, when the second sense amplification unit 200, forming a latch structure having a characteristic of maintaining an existing voltage level, is operated, it may hinder the write operation. In particular, since the second sense amplification unit 200 having a low threshold voltage operates as a strong latch, the second sense amplification unit 200 may hinder the write operation.

Therefore, at the initial stage of the write operation, the control unit 300 deactivates the switching signal SG. After a certain time passes, that is, when the bit line pair BL and BLB, e.g., the bit line BL shares a part of the voltage level of data applied from outside, the control unit 300 activates the switching signal SG to operate the second sense amplification unit 200.

The detailed configuration of the control unit 300 will be described below.

Figure 4:
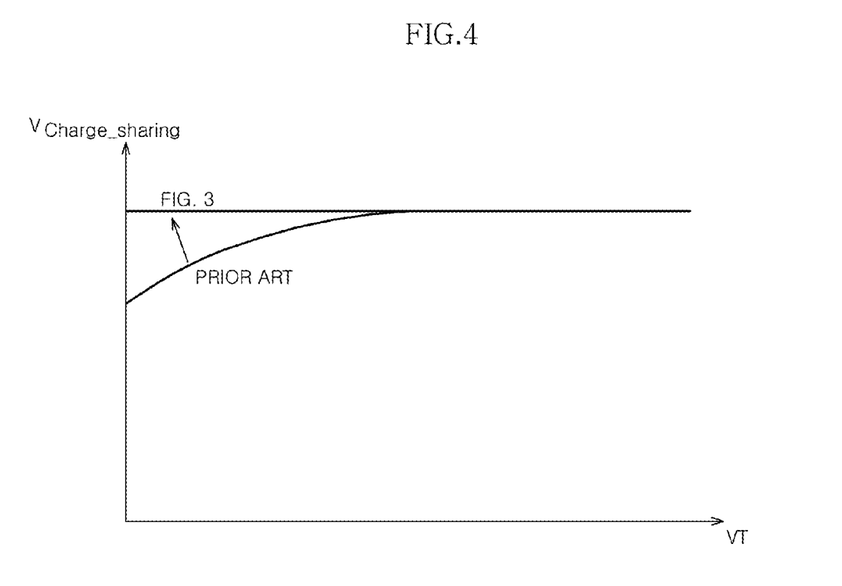
FIG. 4 is a graph showing the relationship between a threshold voltage and a charge sharing voltage when the known bit line sense amplifier and the bit line sense amplifier of FIG. 3 are used.
Figure 5:
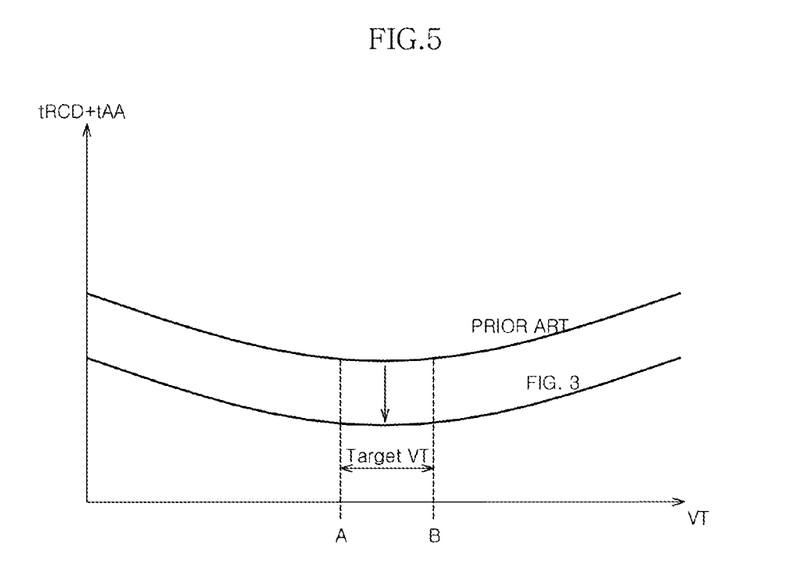
FIG. 5 is a graph showing the relationship between a threshold voltage and a time required for outputting data when the known bit line sense amplifier and the bit line sense amplifier of FIG. 3 are used.

FIG. 4 is a graph showing the relationship between a threshold voltage and a charge sharing voltage when the known bit line sense amplifier is used and the bit line sense amplifier of FIG. 3 is used. FIG. 5 is a graph showing the relationship between a threshold voltage and a time required for outputting data when the known bit line sense amplifier is used and the bit line sense amplifier of FIG. 3 is used.

Referring to FIG. 4, it can be seen that, as the threshold voltage VT of the transistor in the known bit line sense amplifier is lowered, a leakage current occurs to lower the charge sharing voltage Vcharge_sharing shared by the bit line. On the other hand, the bit line sense amplifier of FIG. 3, further including the second sense amplification unit 200, connects the driving voltage of the second sense amplification unit 200 to the ground driving signal SB, thereby minimizing the occurrence of leakage current. Therefore, although the threshold voltage VT of the transistor is lowered, the charge sharing voltage Vcharge_sharing may be maintained.

As described above, the bit line sense amplifier of FIG. 3 further includes the second sense amplifier 200, and connects the driving voltage of the second amplification unit 200 to the ground driving signal SB to thereby reduce a leakage current. Therefore, referring to FIG. 5, the bit line sense amplifier may shorten a time tRCD+tAA required for outputting data after the application of the active signal, compared to the known bit line sense amplifier. Since the time tRCD+tAA required for outputting data after the application of the active signal has a U-shaped characteristic with respect to the threshold voltage VT, the threshold voltage VT may be set in a period A through B where the smallest time tRCD+tAA is consumed.

Figure 6:
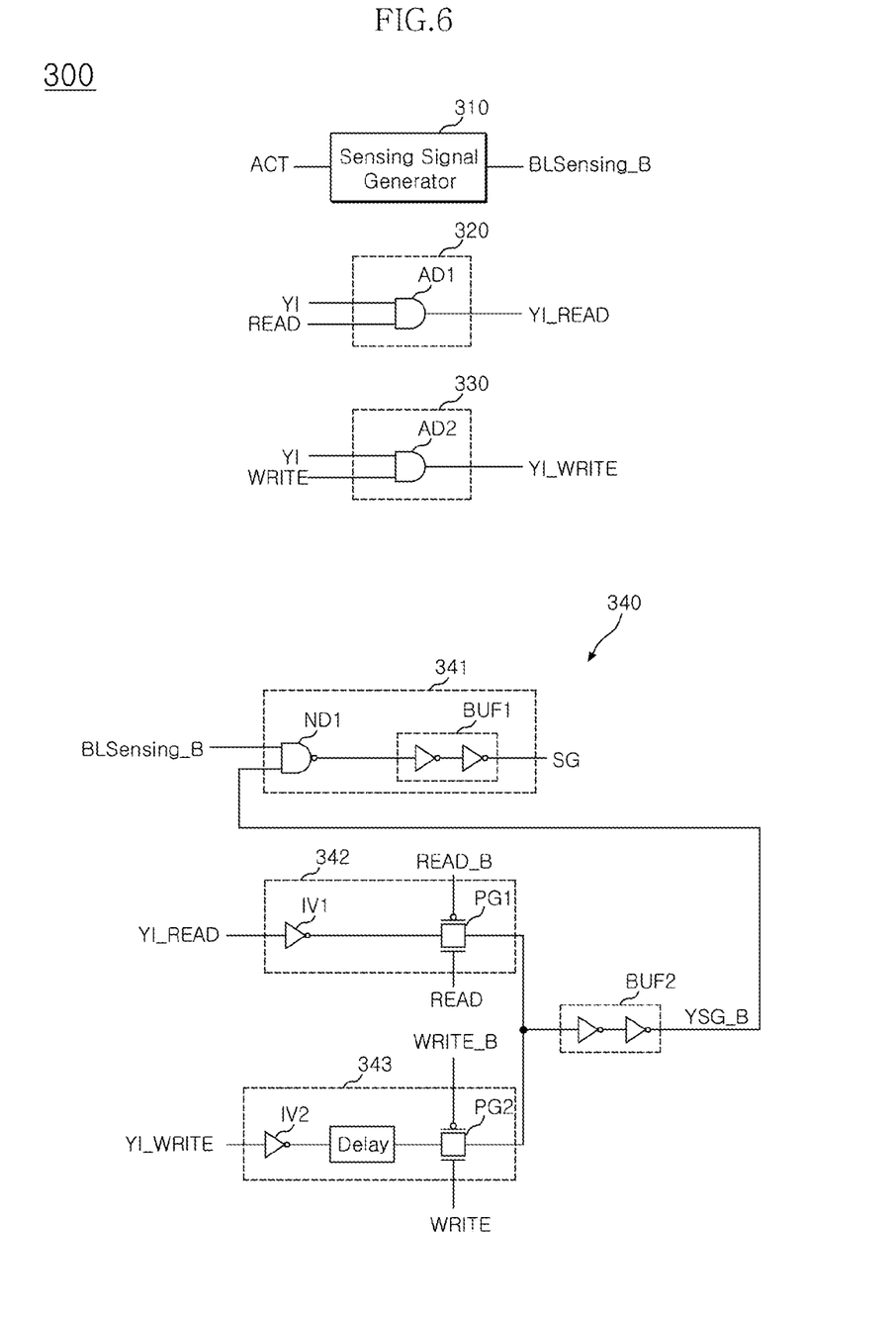
FIG. 6 is a circuit diagram of a control unit of FIG. 3.

FIG. 6 is a circuit diagram of the control unit 300.

The control unit 300 may include a sensing signal generator 310, a read select signal generator 320, and a switching signal generator 340.

The sensing signal generator 310 is configured to receive the active signal ACT and sense a bit line sensing signal BLsensing_B. When a word line is enabled and charge corresponding to stored, the bit line sensing signal BLsensing_B is activated to sense the data. Here, the data may be sensed by sensing the charge which has been shared to the bit line pair BL. In other words, when the activated active signal ACT is applied to drive the power driving signal RTO and the ground driving signal SB to the core voltage and the ground voltage level, respectively, that is, when the bit line sense amplifier is enabled, the sensing signal generator 310 activates the bit line sensing signal BLsensing_B.

The read select signal generator 320 is configured to activate a read select signal YI_READ when a corresponding bit line is selected during a read operation. Specifically, the read select signal generator 320 includes a first AND gate AD1 configured to receive a read signal READ and a column select signal YI.

The switching signal generator 340 is configured to activate the switching signal SG when any one of the bit line sensing signal BLsensing_B and the read select signal YI_READ is activated.

Specifically, the switching signal generator 340 may include a signal output section 341 and a read selection section 342.

The read selection section 342 includes a first inverter IV1 and a first pass gate PG1.

The first inverter IV1 is configured to invert and output the read select signal YI_READ, and the first pass gate PG1 is configured to output the output signal of the first inverter IV1 as a switching control signal YSG_B according to the read signals READ and READ_B.

That is, the read selection section 342 outputs the read select signal YI_READ as the switching control signal YSG_B during a read operation. Here, the switching control signal YSG_B may be buffered by a second buffer BUF2.

The signal output section 341 includes a first NAND gate ND1.

The first NAND gate ND1 is configured to receive the bit line sensing signal BLsensing_B and the switching control signal YSG_B and generate the switching signal SG. The switching signal SG may be buffered by a first buffer BUF1.

That is, the signal output section 341 activates the switching signal SG when any one of the bit line sensing signal BLsensing_B and the switching control signal YSG_B is activated, e.g., to a logic low level.

Therefore, when the word line is enabled to perform a bit line sensing operation or when a read operation is performed on a is memory cell coupled to the corresponding bit line, the control unit 300 may activate the switching signal SG.

Furthermore, even when a write operation is performed, the control unit 300 may activate the switching signal SG.

That is, the control unit 300 may further include a write select signal generator 330, and the switching signal generator 340 may further include a write selection section 343.

The write select signal generator 330 activates a write select signal YI_WRITE when a corresponding bit line is selected during the write operation. Specifically, the write select signal generator 330 includes a second AND gate AD2 configured to receive a write signal WRITE and a column select signal YI.

The write selection section 343 includes a second inverter IV1, a delay Delay, and a second pass gate PG2.

The second inverter IV2 is configured to invert the write select signal YI_WRITE, and the delay Delay is configured to delay an output signal of the second inverter IV2 by a predetermined time. The second pass gate PG2 is configured to output an output signal of the delay Delay as the switching control signal YSG_B according to the write signals WRITE and WRITE_B.

That is, the write selection section 343 is configured to output the write select signal YI_WRITE as the switching control signal YSG_B after a predetermined time, during the write operation.

Therefore, the control unit 300 may activate the switching signal SG, even when a write operation is performed in the is corresponding bit line as well as when the word line is enabled to perform a bit line sensing operation and when a read operation is performed in the corresponding bit line.

Figure 7:
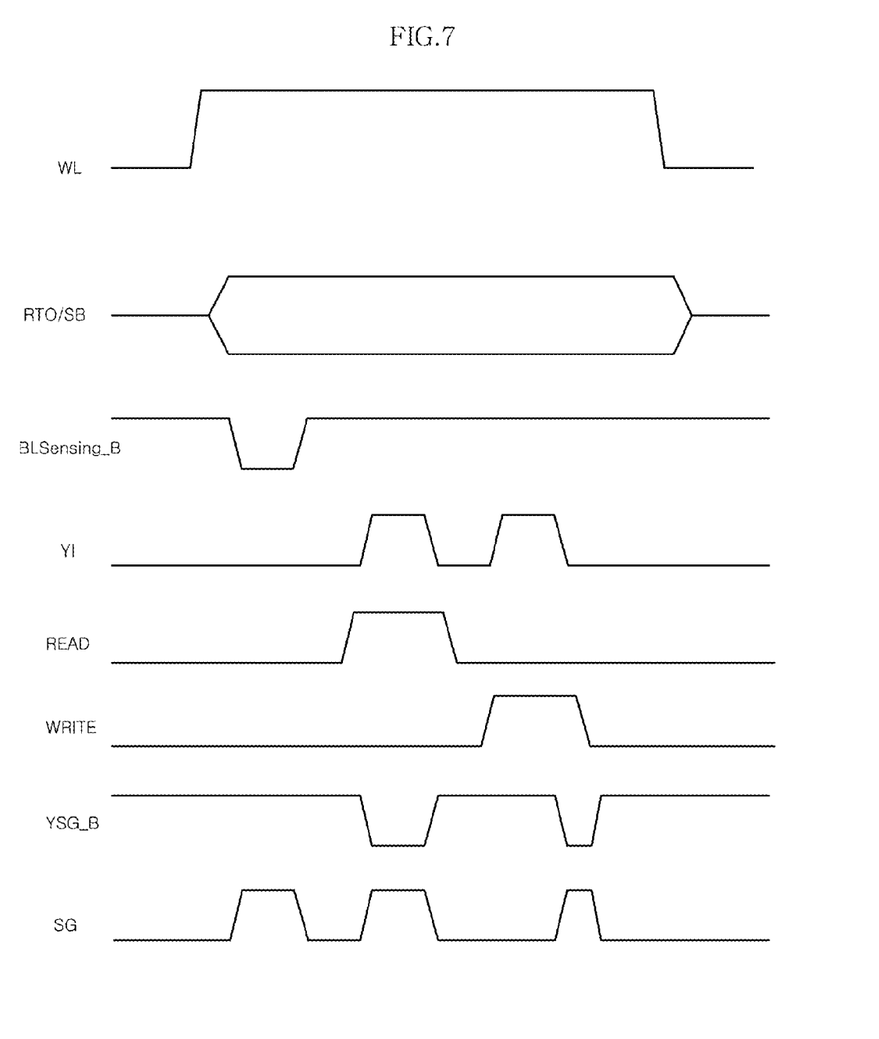
FIG. 7 is an operation waveform diagram of the semiconductor memory apparatus according to an embodiment of the present invention.

FIG. 7 is an operation waveform diagram of the semiconductor memory apparatus of FIG. 6.

When the active signal ACT is applied to enable the word line WL, the bit line sense amplifier driving signals RTO and SB are transitioned to the core voltage level and the ground voltage level, respectively. Also, the bit line sensing signal BLsensing_B is enabled for a predetermined period.

Then, a read operation or write operation may be performed. First, when the read signal READ is activated and the corresponding column select signal YI is activated, the switching control signal YSG_B is activated.

Furthermore, when the write signal WRITE is activated and the corresponding column select signal YI is activated, the switching control signal YSG_B is activated after a predetermined time.

Therefore, the switching signal SG is activated when the bit line sensing BLsensing_B or the switching control signal YSG_B is activated.

Figure 8:
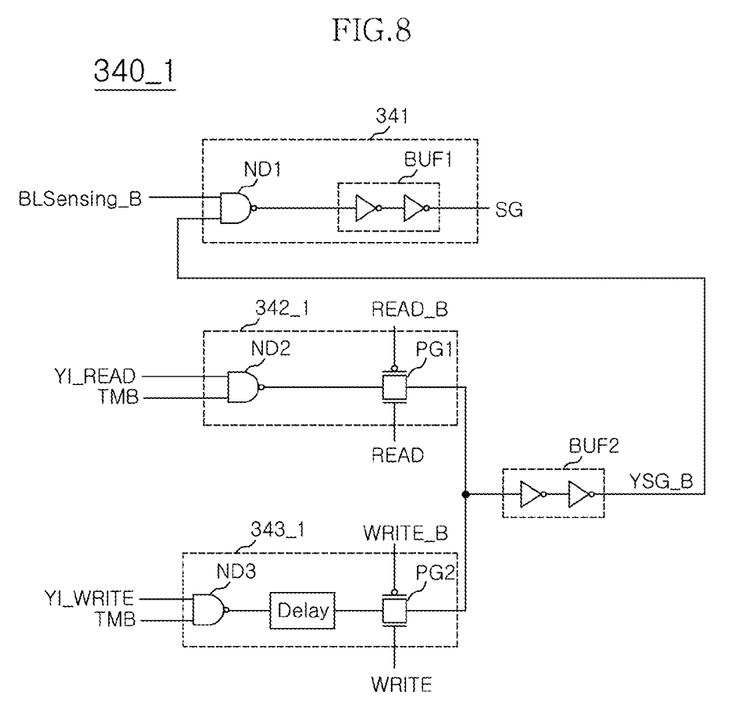
FIG. 8 is a circuit diagram illustrating another example of the control unit of FIG. 3.

FIG. 8 is a circuit which is implemented to determine whether or not the operation of the second sense amplification 200 has an effect on data sensing during a read operation or write operation, through a test mode.

The circuit for implementing the test mode may include a modified switching signal generator 340_1. That is, the switching signal generator 340 of FIG. 6 was modified in such a manner that the read selection section 342 and the write selection section 343 may operate according to a test mode signal TM.

The modified read selection section 342_1 includes a second NAND gate ND2 and a first pass gate PG1.

The second NAND gate ND2 is configured to receive the read select signal YI_READ and an inverted test mode signal TMB, and the first pass gate PG1 is configured to pass an output of the second NAND gate ND2 according to the read signals READ and READ_B.

That is, the read selection section 342_1 outputs the read select signal YI_READ as the switching control signal YSG_B during a read operation for the corresponding bit line, when not in the test mode. In the test mode, however, the read selection section 342_1 outputs the deactivated switching control signal YSG_B at all times. Therefore, it is possible to verify the effect of the second sense amplification unit 200 during the read operation, using the test mode.

The modified write selection section 343_1 includes a third NAND gate ND3, a delay Delay, and a second pass gate PG2.

The third NAND gate ND3 is configured to receive a write select signal YI_WRITE and the inverted test mode signal TMB, and the delay Delay is configured to delay an output of the third NAND gate ND3 by a predetermined time. The second pass gate PG2 is configured to pass an output of the delay Delay according to the write signals WRITE and WRITE_B.

That is, the write selection section 343_1 outputs the write select signal YI_WRITE as the switching control signal YSG_B during the write operation for the corresponding bit line, when not in the test mode. In the test mode, however, the write selection section 342_1 outputs the deactivated switching control signal YSG_B at all times. Therefore, it is possible to verify the effect of the second sense amplification unit 200 during the write operation, using the test mode.

Figure 9:
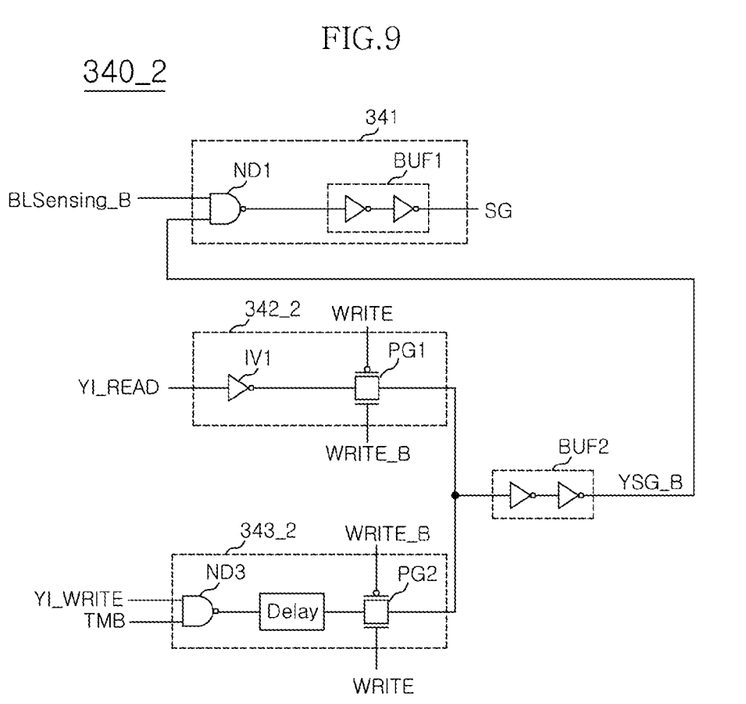
FIG. 9 is a circuit diagram illustrating another example of the control unit of FIG. 3.

FIG. 9 is a circuit diagram illustrating another example of the switching signal generator for implementing the test mode.

The test mode according to an embodiment of the present invention is configured based on the following aspect. The second sense amplification unit 200 is operated at the same time as the read operation of the corresponding bit line, thereby achieving an expectable amplification effect to a certain extent. During the write operation, however, since the second sense amplification unit 200 is operated at a time point delayed by a predetermined period, it is difficult to expect the effect of the second sense amplification unit 200.

That is, when a normal operation is performed, the second sense amplification unit 200 may be operated only during the read operation of the corresponding bit line. Furthermore, the second sense amplification unit 200 may be operated through the test mode even during the write operation of the corresponding bit line. Therefore, it is possible to verify the effect of the second sense amplification unit 200 on the write operation.

The switching signal generator 340_2 includes a signal output section 341, the read selection section 342_2, and the write selection section 343_2.

The signal output section 341 may have the same configuration as the signal output section of FIG. 6. That is, when any one of the bit line sensing signal BLsensing_B and the switching control signal YSG_B is activated, the signal output section 341 activates the switching signal SG.

The read selection section 342_2 includes a first inverter IV1 and a first pass gate PG1.

The first inverter IV1 is configured to invert the read select signal YI_READ, and when a write operation is not performed, the first pass gate PG1 is configured to pass an output of the first inverter IV1 according to the write signals WRITE and WRITE_B.

The write selection section 343_2 includes a third NAND gate ND3, a delay Delay, and a second pass gate PG2.

The third NAND gate ND3 is configured to receive the write select signal YI_WRITE and the test mode signal TM, and the delay Delay is configured to delay an output of the third NAND gate ND3 by a predetermined period. The second pass gate PG2 is configured to pass an output of the delay Delay during the write operation, according to the write signals WRITE and WRITE_B.

According to an embodiment of the present invention, when the activated write select signal YI_WRITE is inputted during the test mode, the switching signal SG is activated after a predetermined time, thereby operating the second sense amplification unit 200. As the time required for the write operation in the test mode is compared to the time required for a write operation in a normal mode, it is possible to verify the effect of the second sense amplification unit 200 during the write operation.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a first sense amplification unit comprising first and second inverters configured to be driven to voltage levels of a power driving signal and a ground driving signal and forming a latch structure between a bit line and a bit line bar; and
   a second sense amplification unit comprising first and second transistors, wherein the first transistor and the second transistors are connected to the ground driving signal, and configured to be driven to the voltage level of the ground driving signal and forming a latch structure between the bit line and the bit line bar when an activated switching signal is applied,
   wherein a threshold voltage of the second sense amplification unit is set lower than that of the first sense amplification unit.

2. The semiconductor memory apparatus according to claim 1, wherein the power driving signal and the ground driving signal have a precharge voltage level in a standby state, and have a core voltage level and a ground voltage level, respectively, in an active state.

3. The semiconductor memory apparatus according to claim 2, wherein the second sense amplification unit further comprises:
   a voltage passing section configured to pass voltages of the bit line and the bit line bar in response to the activated switching signal,
   wherein the first transistor couples the bit line bar to the node where the ground driving signal is inputted depending on the voltage level of the bit line, and
   the second transistor couples the bit line to the node where the ground driving signal is inputted depending on the voltage level of the bit line bar.

4. The semiconductor memory apparatus according to claim 3, wherein the first and second transistors comprise first and second NMOS transistors, respectively.

5. The semiconductor memory apparatus according to claim 4, wherein the voltage passing section comprises:
   a third NMOS transistor configured to receive the voltage level of the bit line bar through a source terminal of the third NMOS is transistor in response to the switching signal; and
   a fourth NMOS transistor configured to receive the voltage level of the bit line through a source terminal of the fourth NMOS transistor in response to the switching signal.

6. The semiconductor memory apparatus according to claim 2, further comprising a control unit configured to generate the activated switching signal according to an activated active signal and read signal.

7. The semiconductor memory apparatus according to claim 6, wherein the control unit comprises:
   a sensing signal generator configured to generate an activated bit line sensing signal from the activated active signal;
   a read select signal generator configured to generate an activated read select signal, when both of a column select signal and the read signal are activated; and
   a switching signal generator configured to activate the switching signal when any one of the bit line sensing signal and the read select signal is activated.

8. The semiconductor memory apparatus according to claim 7, wherein the sensing signal generator activates the bit line sensing signal when the bit line sense amplifier is enabled.

9. The semiconductor memory apparatus according to claim 8, wherein the switching signal generator maintains the switching signal in a deactivation state even though the read select signal is activated, during a test mode.

10. The semiconductor memory apparatus according to claim 9, wherein the switching signal generator comprises:
    a read selection section configured to receive the read select signal in response to activation of the read signal and output the received signal as a switching control signal when a deactivated test mode signal is applied, and configured to output the deactivated switching control signal when the activated test mode signal is applied; and
    a signal output section configured to activate the switching signal when any one of the bit line sensing signal and the switching control signal is activated.

11. The semiconductor memory apparatus according to claim 7, wherein the switching signal generator comprises:
    a read selection section configured to receive the read select signal when the read signal is activated, and output the received signal as a switching control signal; and
    a signal output section configured to activate the switching signal when any one of the bit line sensing signal and the switching control signal is activated.

12. A semiconductor memory apparatus comprising:
    a first sense amplification unit comprising first and second inverters configured to be driven to voltage levels of a power driving signal and a ground driving signal and forming a latch structure between a bit line and a bit line bar;
    a control unit configured to generate an activated switching signal according to an activated active signal, a read signal and a write signal; and
    a second sense amplification unit comprising first and second transistors, wherein the first transistor and the second transistors are connected to the ground driving signal, and configured to be driven to the voltage level of the ground driving signal and forming a latch structure between the bit line and the bit line bar when the activated switching signal is applied,
    wherein a threshold voltage of the second sense amplification unit is set lower than that of the first sense amplification unit.

13. The semiconductor memory apparatus according to claim 12, wherein the power driving signal and the ground driving signal have a precharge voltage level in a standby state, and have a core voltage level and a ground voltage level, respectively, in an active to state.

14. The semiconductor memory apparatus according to claim 13, wherein the second sense amplification unit further comprises:
   a voltage passing section configured to pass voltages of the bit line and the bit line bar in response to the activated switching signal,
   wherein the first transistor couples the bit line bar to the node where the ground driving signal is inputted depending on the voltage level of the bit line, and
   the second transistor couples the bit line to the node where the ground driving signal is inputted depending on the voltage level of the bit line bar.

15. The semiconductor memory apparatus according to claim 13, wherein the control unit comprises:
   a sensing signal generator configured to generate an activated bit line sensing signal from the activated active signal;
   a read select signal generator configured to generate an activated read select signal, when both of a column select signal and the read signal are activated;
   a write select signal generator configured to generate an activated write select signal, when both of the column select signal and the write signal are activated; and
   a switching signal generator configured to activate the switching signal when any one of the bit line sensing signal, the read select signal and the write select signal is activated.

16. The semiconductor memory apparatus according to claim 15, wherein the sensing signal generator activates the bit line sensing signal when the bit line sense amplifier is enabled.

17. The semiconductor memory apparatus according to claim 16, wherein the switching signal generator comprises:
   a read selection section configured to receive the read select signal when the write signal is deactivated, and output the received signal as the switching control signal; and
   a write selection section configured to receive the write select signal in response to activation of the write signal, delay the received signal by a predetermined time, and output the delayed signal as the switching control signal when the activated test mode signal is applied, and configured to output the deactivated switching control signal when the deactivated test mode signal is applied; and
   a signal output section configured to activate the switching signal when any one of the bit line sensing signal and the switching is control signal is activated.

18. The semiconductor memory apparatus according to claim 15, wherein the switching signal generator comprises:
   a read selection section configured to receive the read select signal when the read signal is activated, and output the received signal as a switching control signal;
   a write selection section configured to receive the write select signal when the write signal is activated, delay the received signal by a predetermined time, and output the delayed signal as the switching control signal; and
   a signal output section configured to activate the switching signal when any one of the bit line sensing signal and the switching control signal is activated.

19. The semiconductor memory apparatus according to claim 15, wherein the switching signal generator maintains the switching signal in a deactivation state even though the read select signal or the write select signal is activated, during a test mode.

20. The semiconductor memory apparatus according to claim 19, wherein the switching signal generator comprises:
   a read selection section configured to receive the read select signal in response to activation of the read signal and output the received signal as a switching control signal when a deactivated test mode signal is applied, and configured to output the deactivated is switching control signal when the activated test mode signal is applied;
   a write selection section configured to receive the write select signal in response to activation of the write signal, delay the received signal by a predetermined time, and output the delayed signal as the switching control signal when the deactivated test mode signal is applied, and configured to output the deactivated switching control signal when the activated test mode signal is applied; and
   a signal output section configured to activate the switching signal when any one of the bit line sensing signal and the switching control signal is activated.

* * * * *